United States Patent
Castro et al.

(10) Patent No.: US 11,315,633 B2
(45) Date of Patent: Apr. 26, 2022

(54) THREE-STATE PROGRAMMING OF MEMORY CELLS

(71) Applicant: Micron Technology, Inc., Boise, ID (US)

(72) Inventors: Hernan A. Castro, Shingle Springs, CA (US); Jeremy M. Hirst, Orangevale, CA (US); Shanky K. Jain, Folsom, CA (US); Richard K. Dodge, Santa Clara, CA (US); William A. Melton, Shingle Springs, CA (US)

(73) Assignee: Micron Technology, Inc., Boise, ID (US)

( * ) Notice: Subject to any disclaimer, the term of this patent is extended or adjusted under 35 U.S.C. 154(b) by 48 days.

(21) Appl. No.: 16/729,731

(22) Filed: Dec. 30, 2019

(65) Prior Publication Data
US 2021/0201995 A1 Jul. 1, 2021

(51) Int. Cl.
*G11C 13/00* (2006.01)
(52) U.S. Cl.
CPC ........ *G11C 13/0069* (2013.01); *G11C 13/003* (2013.01); *G11C 13/004* (2013.01); *G11C 2013/0078* (2013.01); *G11C 2213/15* (2013.01); *G11C 2213/71* (2013.01)
(58) Field of Classification Search
CPC .......................... G11C 13/0069; G11C 13/003
USPC ........................................................ 365/148
See application file for complete search history.

(56) References Cited

U.S. PATENT DOCUMENTS

| | | | |
|---|---|---|---|
| 8,031,516 B2 * | 10/2011 | Tang | G11C 13/0069 365/163 |
| 9,117,519 B2 | 8/2015 | Spessot et al. | |
| 9,613,695 B2 | 4/2017 | Spessot et al. | |
| 10,366,747 B2 | 7/2019 | Castro | |
| 10,395,738 B2 * | 8/2019 | Castro | G11C 13/004 |
| 10,490,276 B2 | 11/2019 | Yasuhara | |
| 2008/0117669 A1 | 5/2008 | Fuji et al. | |
| 2009/0207645 A1 | 8/2009 | Parkinson | |
| 2011/0134685 A1 | 6/2011 | Kau et al. | |
| 2015/0262661 A1 | 9/2015 | Chu et al. | |
| 2016/0064078 A1 | 3/2016 | Fantini et al. | |
| 2016/0133319 A1 * | 5/2016 | Fantini | G11C 13/0004 365/163 |
| 2019/0164611 A1 | 5/2019 | Castro | |

OTHER PUBLICATIONS

International Search Report and Written Opinion from related International PCT Application No. PCT/US2020/064194, dated Mar. 26, 2021, 11 pages.
Office Action from related Taiwan Patent Application No. 109146403, dated Nov. 4, 2021, 14 pages.

* cited by examiner

*Primary Examiner* — Anthan Tran
(74) *Attorney, Agent, or Firm* — Brooks, Cameron & Huebsch, PLLC

(57) ABSTRACT

The present disclosure includes apparatuses, methods, and systems for three-state programming of memory cells. An embodiment includes a memory having a plurality of memory cells, and circuitry configured to program a memory cell of the plurality of memory cells to one of three possible data states by applying a voltage pulse to the memory cell, determining whether the memory cell snaps back in response to the applied voltage pulse, and applying an additional voltage pulse to the memory cell based on the determination of whether the memory cell snaps back.

22 Claims, 6 Drawing Sheets

THREE-STATE PROGRAMMING OF MEMORY CELLS

TECHNICAL FIELD

The present disclosure relates generally to semiconductor memory and methods, and more particularly, to three-state programming of memory cells.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, comprise a single material which can serve as both a select element and a storage element for the memory cell.

DETAILED DESCRIPTION

Figure 1:
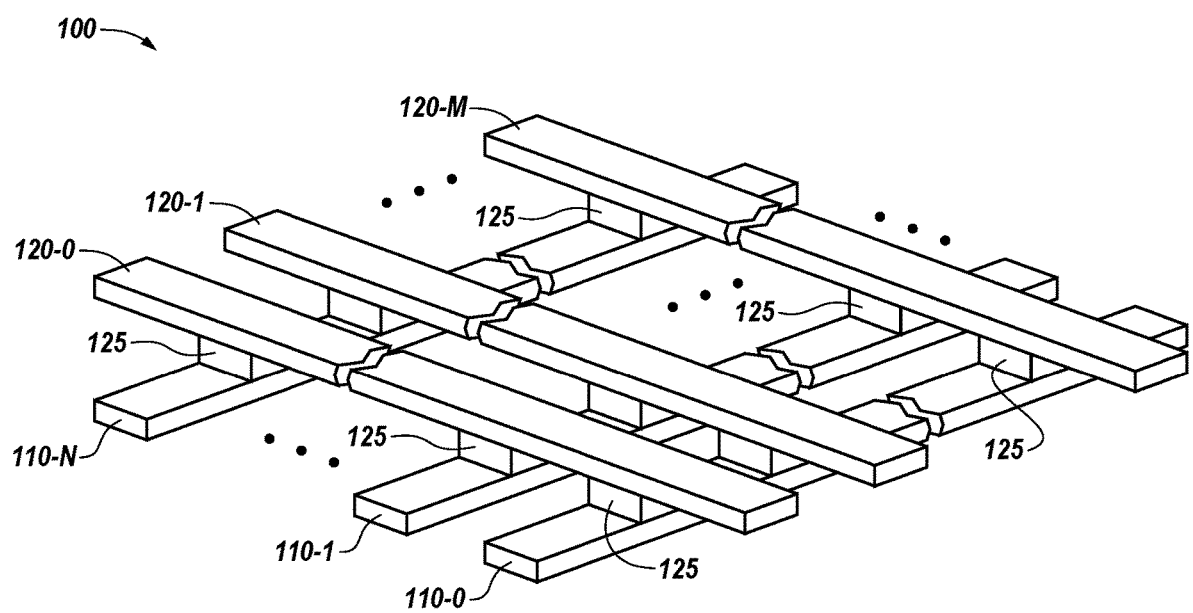
FIG. 1 is a three-dimensional view of an example of a memory array, in accordance with an embodiment of the present disclosure.

The present disclosure includes apparatuses, methods, and systems for three-state programming of memory cells. An embodiment includes a memory having a plurality of memory cells, and circuitry configured to program a memory cell of the plurality of memory cells to one of three possible data states by applying a voltage pulse to the memory cell, determining whether the memory cell snaps back in response to the applied voltage pulse, and applying an additional voltage pulse to the memory cell based on the determination of whether the memory cell snaps back.

Embodiments of the present disclosure can provide benefits, such as increased density, reduced cost, reduced power consumption, and/or faster and/or more complex operations, as compared to previous memory devices. For example, previous approaches for programming resistance variable memory cells, such as self-selecting memory cells, may be able to generate two different states for the cells, such that the cells can be programmed to one of two possible data states (e.g., state 0 or state 1). However, programming approaches for resistance variable memory cells in accordance with the present disclosure can generate an additional (e.g., third) state for the cells, such that the cells can be programmed to one of three possible data states.

Such three-state programming can be useful in supporting complex memory operations, such as, for instance, machine learning applications, in which data is encoded and matching functions or partial matching functions (e.g., Hamming distances) are computed. For instance, such three-state programming can support the computation of the matching function or partial matching function of an input vector pattern with many stored vectors in an efficient manner.

Further, such three-state programming can be useful for reducing the cost and/or increasing the density of standard memory applications. For example, such three-state programming can reduce (e.g., by 63%) the number of bits needed to encode the equivalent number of data states utilizing previous two-state programming approaches. These extra bits could be used for error correction code (ECC) and/or data redundancy operations, for instance.

As used herein, "a", "an", or "a number of" can refer to one or more of something, and "a plurality of" can refer to two or more such things. For example, a memory device can refer to one or more memory devices, and a plurality of memory devices can refer to two or more memory devices. Additionally, the designators "N" and "M", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality second signal lines (e.g., second access lines), which may be referred to as bit lines 120-0 to 120-M) that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be resistance variable memory cells, for example. The memory cells 125 may include a material programmable to different data states. In some examples, each of memory cells 125 may include a single material that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. In some examples, each memory cell 125 may include a ternary composition that may include selenium (Se), arsenic (As), and germanium (Ge), a quaternary composition that may include silicon (Si), Se, As, and Ge, etc.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

Figure 2A:
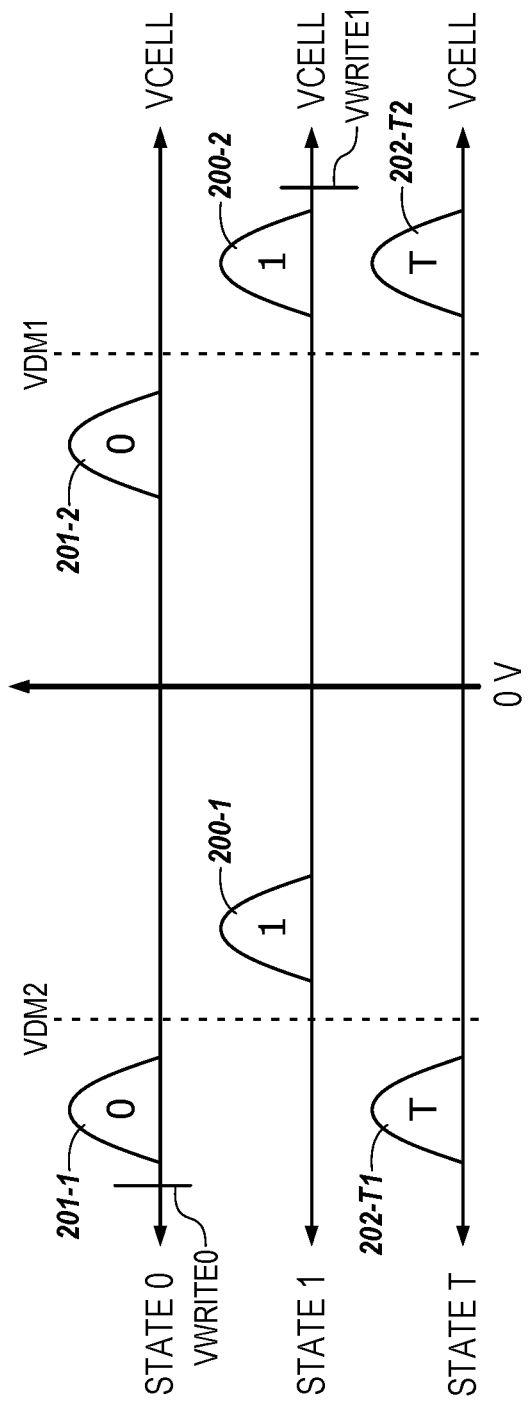
FIG. 2A illustrates threshold voltage distributions associated with memory states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of three possible data states (e.g., state 0, state 1, or state T). That is, FIG. 2A illustrates threshold voltage distributions associated with three possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 200-1, 200-2, 201-1, 201-2, 202-T1, and 202-T2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
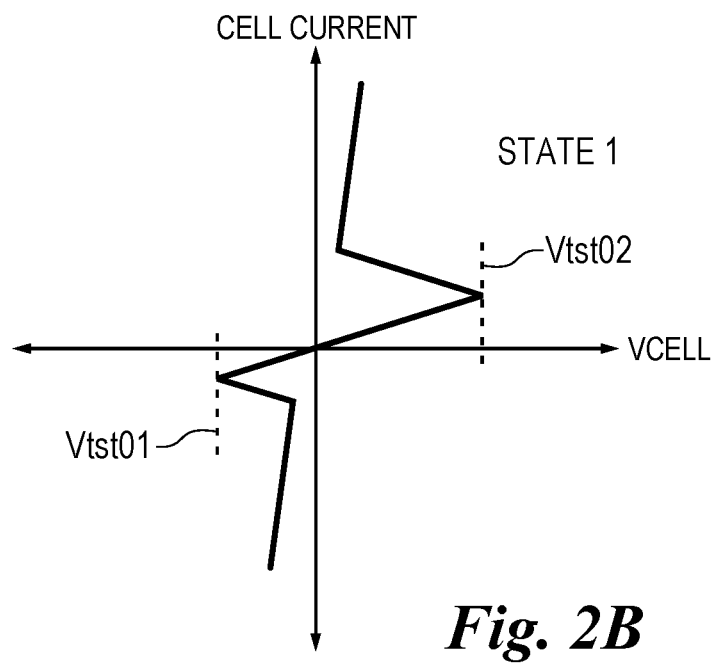
FIG. 2B is an example of a current-versus-voltage curve corresponding to a memory state of FIG. 2A, in accordance with an embodiment of the present disclosure.
Figure 2C:
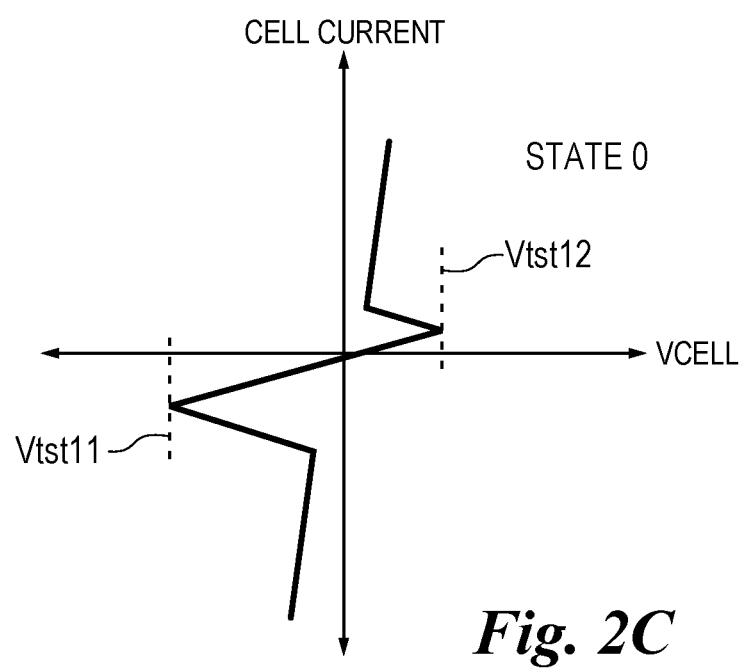
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 201-1 and 201-2) whose magnitude is greater for a negative polarity than a positive polarity, and a second data state (e.g., state 1) is associated with a second asymmetric threshold voltage distribution (e.g., threshold voltage distributions 200-1 and 200-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

In some examples, the magnitudes of the threshold voltages of a memory cell 125 in a particular state may be symmetric for different polarities, as shown in FIG. 2A. For example, the threshold voltage of a memory cell 125 programmed to state T may have the same magnitude in opposite polarities. For instance, in the example illustrated in FIG. 2A, a third data state (e.g., state T) is associated with a symmetric threshold voltage distribution (e.g., threshold voltage distributions 202-T1 and 202-T2) whose magnitude is substantially equal (e.g. high) for both a positive polarity and a negative polarity. In such an example, an applied voltage magnitude sufficient to cause a memory cell 125 to snap back can be the same for different applied voltage polarities.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 201-2) from cells in state 1 (e.g., threshold voltage distribution 200-2) or state T (e.g., threshold voltage distribution 202-T2). Similarly, VDM2 is a negative voltage used to distinguish cells in state 1 (e.g., threshold voltage distribution 200-1) from cells in state 0 (e.g., threshold voltage distribution 201-1) or state T (e.g., threshold voltage distribution 202-T1). In the examples of FIGS. 2A-2C, a memory cell 125 in a positive state 1 or T does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 or T does not snap back in response to applying VDM2.

Embodiments are not limited to the example shown in FIG. 2A. For example, the designations of state 0 and state 1 can be interchanged (e.g., distributions 201-1 and 201-2 can be designated as state 1 and distributions 200-1 and 200-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 200-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 200-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 201-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 201-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 201-2). As such, in a number of embodiments, a snapback event can be used to write a cell to the opposite state (e.g., from state 1 to state 0 and vice versa).

In an embodiment of the present disclosure, a memory cell, such as memory cells 125 illustrated in FIG. 1, can be programmed to one of three possible data states (e.g., state 0, state 1, or state T) by applying a voltage pulse to the memory cell, determining whether the memory cell snaps back in response to the applied voltage cell, and applying (e.g., determining whether to apply) an additional voltage pulse to the memory cell based on the determination of whether the memory cell snaps back. For instance, the current data state of the memory cell can be determined based on the determination of whether the memory cell snaps back, and the additional voltage pulse can be applied to the memory cell (e.g., it can be determined whether to apply the additional voltage pulse to the memory cell) based on the determination of the current data state of the cell.

For example, a bias voltage pulse (e.g., VCELL) with a magnitude high enough to cause (e.g., to be capable of causing) the memory cell to snap back can be applied to the cell. The bias voltage pulse can comprise, for instance, a voltage pulse having a first polarity and/or a voltage pulse having a second polarity that is opposite the first polarity. For instance, applying the bias voltage pulse can comprise applying a positive 5.5 Volt (V) pulse and/or a negative 5.5 V pulse to the memory cell.

Once (e.g., if) the memory cell snaps back to the conductive state in response to the applied bias voltage pulse, a pulse of current (e.g., a current transient) may flow through the memory cell. After a particular amount of time, the current transient through the cell may dissipate, and a DC current may be established across the cell. An example illustrating such a current flow through the memory cell will be further described herein (e.g., in connection with FIG. 4).

After the voltage pulse (e.g., the bias voltage pulse) has been applied to the memory cell, it can be determined whether the memory cell has snapped back in response to the applied voltage pulse (e.g., in response to the positive or negative pulse). This determination can be made by, for example, sensing a voltage change associated with the memory cell (e.g., on a signal line coupled to the cell) that has occurred in response to the applied voltage pulse. For instance, sensing such a voltage change may indicate that the memory cell has snapped back, while sensing no voltage change may indicate that a snapback event has not occurred. An example further illustrating such a determination of whether the memory cell has snapped back, and the circuitry that can be used to perform such a determination, will be further described herein (e.g., in connection with FIG. 3).

The current data state of the memory cell can then be determined based on the determination of whether the memory cell has snapped back. For instance, a data value indicative of the current data state can be latched (e.g., stored in a latch) upon determining the memory cell has snapped back, as will be further described herein (e.g., in connection with FIG. 3).

After determining the memory cell has snapped back (e.g., after a delay to allow for the current transient through the memory cell to dissipate), the current to the memory cell (e.g., the current flow through the signal line coupled to the memory cell) may be turned off (e.g., inhibited). An additional voltage pulse can then be applied to the memory cell (e.g., it can be determined whether to apply the additional voltage pulse to the memory cell) based on the determination of whether the memory cell has snapped back (e.g., based on the determination of the current data state of the memory cell). For instance, the additional voltage pulse can be a single short pulse or can comprise a plurality of pulses based on whether the memory cell has snapped back, and/or can be a positive polarity or a negative polarity based on whether the memory cell has snapped back, as will be further described herein. As used herein, a short pulse can refer to a pulse having a duration that is shorter than the duration of the bias voltage. The magnitude of the additional voltage pulse can be the same as the magnitude of the bias voltage, for example. As an additional example, the initial bias voltage pulse may be extended after determining the memory cell has snapped back.

Applying the additional voltage pulse (or extending the initial bias voltage pulse) to a memory cell currently in a 0 state or a 1 state may not change the magnitude of the threshold voltage of the cell if the threshold voltage is a first polarity, but may change the magnitude of the threshold voltage of the cell if the threshold voltage is a second polarity that is opposite the first polarity. For example, the additional voltage pulse may not change a high magnitude threshold voltage of one polarity, but may increase a low magnitude threshold voltage of the opposite polarity from the low magnitude to a high magnitude. For instance, the additional voltage pulse may not change a threshold voltage that is within distribution 201-1, but may move a threshold voltage from distribution 201-2 to 200-2. Similarly, the additional voltage pulse may not change a threshold voltage that is within distribution 200-2, but may move a threshold voltage from distribution 200-1 to 201-1.

In contrast, applying the additional voltage pulse to a memory cell currently in a T state may not change the high magnitude of the threshold voltage of the cell regardless of the polarity of the threshold voltage. For instance, the additional voltage pulse may not change a threshold voltage that is within distribution 202-T1 or 202-T2. As such, embodiments of the present disclosure can program the memory cell to a third data state (e.g., state T), in addition to states 0 and 1.

As an example, to program the memory cell to state T, a first bias voltage (e.g., a detection bias voltage) pulse having a positive polarity can be applied to the cell, and it can be determined whether the memory cell snaps back in response to the applied first bias voltage pulse. If it is determined (e.g., detected) that the memory cell has snapped back, the current data state of the cell may be 0. Upon determining that the memory cell has snapped back in response to the first bias voltage pulse (e.g., that the current data state of the cell is 0), a single (e.g., one) short additional pulse having a negative polarity can be applied to the cell to program the cell to state T.

If no snap back of the memory cell is detected in response to the first bias voltage pulse, the current data state of the cell may be 1 or T. Upon determining that the memory cell did not snap back in response to the first bias voltage pulse, a second bias voltage pulse having a negative polarity can be applied to the cell, and it can be determined whether the cell snaps back in response to the applied second bias voltage pulse.

If it is determined that the memory cell has snapped back in response to the second bias voltage pulse, the current data state of the cell may be 1. Upon determining that the memory cell has snapped back in response to the second bias voltage pulse (e.g., that the current data state of the cell is 1), a single short additional voltage pulse having a positive polarity can be applied to the cell to program the cell to state T. If no snap back of the memory cell is detected in response to the second bias voltage pulse, the current data state of the cell may be T, and no additional pulses may be needed to program the cell to state T. Accordingly, upon determining that the memory cell has not snapped back in response to the second bias voltage pulse (e.g., that the current data state of the cell is T), an additional short voltage pulse may not be applied. An example further illustrating the programming of the memory cell to state T will be further described herein (e.g., in connection with FIGS. 5A-5B).

Additionally or alternatively, the memory cell can be programmed to state T without applying the bias voltage pulse(s) to the cell (e.g., without attempting to detect a snap back of the memory cell or the current data state of the memory cell). For example, two short voltage pulses of opposite polarity (e.g., one positive and one negative, or vice versa) can be applied to the memory cell to program the cell to state T, regardless of the current data state of the cell.

As an additional example, to program the memory cell to state 0, a bias voltage pulse having a positive polarity can be applied to the cell, and it can be determined whether the memory cell snaps back in response to the applied bias voltage pulse. If it is determined (e.g., detected) that the memory cell has snapped back, the current data state of the cell may be 0, and no additional pulses may be needed to program the cell to state 0. Accordingly, upon determining that the memory cell has snapped back in response to the bias voltage pulse (e.g., that the current data state of the cell is 0), no additional voltage pulses may be applied to the memory cell.

If no snap back of the memory cell is detected in response to the bias voltage pulse, the current data state of the cell may be 1 or T. Upon determining that the memory cell did not snap back in response to the bias voltage pulse (e.g., that the current data state of the cell is 1 or T), a plurality of short additional voltage pulses, each having a positive polarity, can be applied to the cell to program the cell to state 0. For instance, six short additional positive voltage pulses can be applied to the cell. Embodiments of the present disclosure, however, are not limited to a particular number of additional voltage pulses. Further, as an additional example, a single voltage pulse having a larger magnitude and/or duration than the bias voltage pulse can be applied to the cell to program the cell to state 0.

Additionally or alternatively, the memory cell can be programmed to state 0 without applying the bias voltage pulse to the cell (e.g., without attempting to detect a snap back of the memory cell or the current data state of the memory cell). For example, a plurality of short voltage pulses, each of positive polarity, can be applied to the memory cell to program the cell to state 0, regardless of the current data state of the cell. Further, as an additional example, a single voltage pulse having a larger magnitude and/or duration than the bias voltage pulse can be applied to the cell to program the cell to state 0.

As an additional example, to program the memory cell to state 1, a first bias voltage pulse having a positive polarity can be applied to the cell, and it can be determined whether the memory cell snaps back in response to the applied first bias voltage pulse. If it is determined (e.g., detected) that the memory cell has snapped back, the current data state of the cell may be 0. Upon determining that the memory cell has snapped back in response to the first bias voltage pulse (e.g., that the current data state of the cell is 0), a plurality of short additional voltage pulses, each having a negative polarity, can be applied to the cell to program the cell to state 1. For instance, six short additional negative voltage pulses can be applied to the cell. Embodiments of the present disclosure, however, are not limited to a particular number of additional voltage pulses. Further, as an additional example, a single voltage pulse having a larger magnitude and/or duration than the first bias voltage pulse can be applied to the cell to program the cell to state 1.

If no snap back of the memory cell is detected in response to the first bias voltage pulse, the current data state of the cell may be 1 or T. Upon determining that the memory cell did not snap back in response to the first bias voltage pulse, a second bias voltage pulse having a negative polarity can be applied to the cell, and it can be determined whether the cell snaps back in response to the applied second bias voltage pulse.

If it is determined that the memory cell has snapped back in response to the second bias voltage pulse, the current data state of the cell may be 1. Upon determining that the memory cell has snapped back in response to the second bias voltage pulse (e.g., that the current data state of the cell is 1), and no additional negative voltage pulses may be needed to program the cell to state 1. Accordingly, upon determining that the memory cell has snapped back in response to the second bias voltage pulse (e.g., that the current data state of the cell is 1), no additional negative voltage pulses may be applied to the memory cell.

If no snap back of the memory cell is detected in response to the second bias voltage pulse, the current data state of the cell may be T. Upon determining that the memory cell has not snapped back in response to the second bias voltage pulse (e.g., that the current data state of the cell is T), the plurality of short additional negative voltage pulses can be applied to the cell to program the cell to state 1. Further, as an additional example, a single voltage pulse having a larger magnitude and/or duration than the second bias voltage pulse can be applied to the cell to program the cell to state 1.

Additionally or alternatively, the memory cell can be programmed to state 1 without applying the bias voltage pulse(s) to the cell (e.g., without attempting to detect a snap back of the memory cell or the current data state of the memory cell). For example, a plurality of short voltage pulses, each of negative polarity, can be applied to the memory cell to program the cell to state 1, regardless of the current data state of the cell. Further, as an additional example, a single voltage pulse having a larger magnitude and/or duration than the bias voltage pulse(s) can be applied to the cell to program the cell to state 1.

Figure 3:
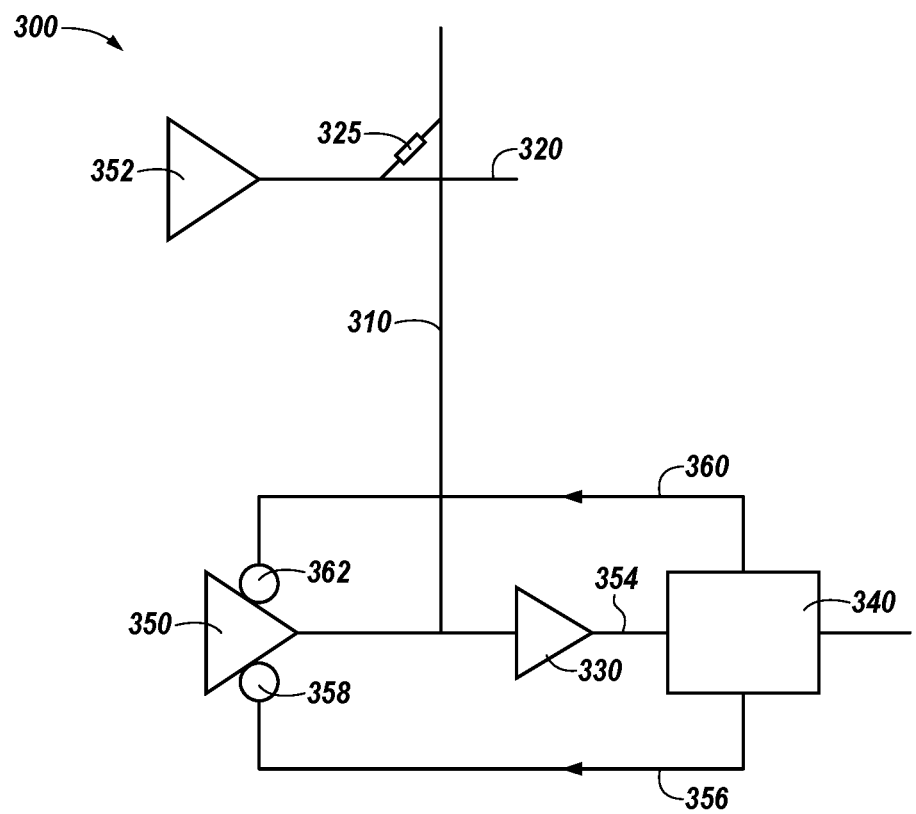
FIG. 3 illustrates an example of a portion of a memory array and associated circuitry, in accordance with an embodiment of the present disclosure.

FIG. 3 illustrates an example of a portion of a memory array 300 and associated circuitry for detecting snapback events in accordance with an embodiment of the present disclosure. Memory array 300 may be a portion of memory array 100 previously described in connection with FIG. 1. Memory cell 325 is coupled to a word line 310 and a bit line 320 and may be operated as described herein.

The example shown in FIG. 3 includes a driver 350 (e.g., a word line driver 350) coupled to word line 310. Word line driver 350 may supply bi-polar (e.g., positive and negative) current and/or voltage signals to word line 310. A sense amplifier 330, which may comprise a cross-coupled latch, is coupled to word line driver 350, and may detect positive and negative currents and/or positive and negative voltages on word line 310. In some examples, sense amplifier 330 may be part of (e.g., included in) word line driver 350. For example, the word line driver 350 may include the sensing functionality of sense amplifier 330. A bit line driver 352 is coupled to bit line 320 to supply positive and/or negative current and/or voltage signals to bit line 320.

The sense amplifier 330 and word line driver 350 are coupled to a latch 340, which can be used to store a data value indicating whether or not a snapback event of cell 325 has occurred responsive to an applied voltage differential. For instance, an output signal 354 of sense amplifier 330 is coupled to latch 340 such that responsive to detection, via sense amplifier 330, of memory cell 325 snapping back, the output signal 354 causes the appropriate data value to be latched in latch 340 (e.g., a data value of "1" or "0" depending on which data value is used to indicate a detected snapback event). As an example, if a latched data value of "1" is used to indicate a detected snapback event, then signal 354 will cause latch 340 to latch a data value of logical 1 responsive to a detected snapback of cell 325, and vice versa.

When a positive voltage differential VDM1 is applied to memory cell 325 (e.g., the word line voltage VWL1 is low and the bit line voltage VBL1 is high) and memory cell 325 stores state 0, voltage differential VDM1 may be greater than the threshold voltage Vtst12 (FIG. 2C), and memory cell 325 may snap back to a conductive state, causing the positive current flow, shown in FIG. 2C, through memory cell 325 from bit line 320 to word line 310. Sense amplifier 330 may detect this current, and/or a voltage associated therewith, for example, and may output signal 354 to latch 340 in response to detecting this current and/or voltage. For example, signal 354 may indicate to latch 340 (e.g., by having a logical high value) that current is positive, and thus that word line voltage is high. In response to the signal 354 indicating that the word line voltage is high, latch 340 may output a signal 356 (e.g. voltage) to circuitry 358 of or coupled to word line driver 350 that turns off (e.g., inhibits) the current flow through word line 310, and thus through memory cell 325.

In examples, when a negative voltage differential VDM2 is applied to memory cell 325 (e.g., the word line voltage VWL2 is high and the bit line voltage VBL2 is low) and memory cell 325 stores state 1, voltage differential VDM2 is greater (in a negative sense) than the threshold voltage Vtst01 (FIG. 2B), and memory cell 328 may snap back to a conductive state, causing the negative current flow, shown in FIG. 2B, through memory cell 325 from word line 310 to bit line 320. Sense amplifier 330 may detect this current, and/or a voltage associated therewith, for example, and may output the signal 354 to latch 340 in response to detecting this current and/or a voltage. For example, signal 354 may indicate to latch 340 that current is negative (e.g., by having a logical low value), and thus that word line voltage is low. In response to the signal 354 indicating that the word line voltage is low, latch 340 may output a signal 360 (e.g. voltage) to circuitry 362 of or coupled to word line driver 350 that turns off the current flow through word line 310. In some examples, sense amplifier 330 in combination with circuitries 358 and 362 may be referred to as detection circuitry.

Figure 4:
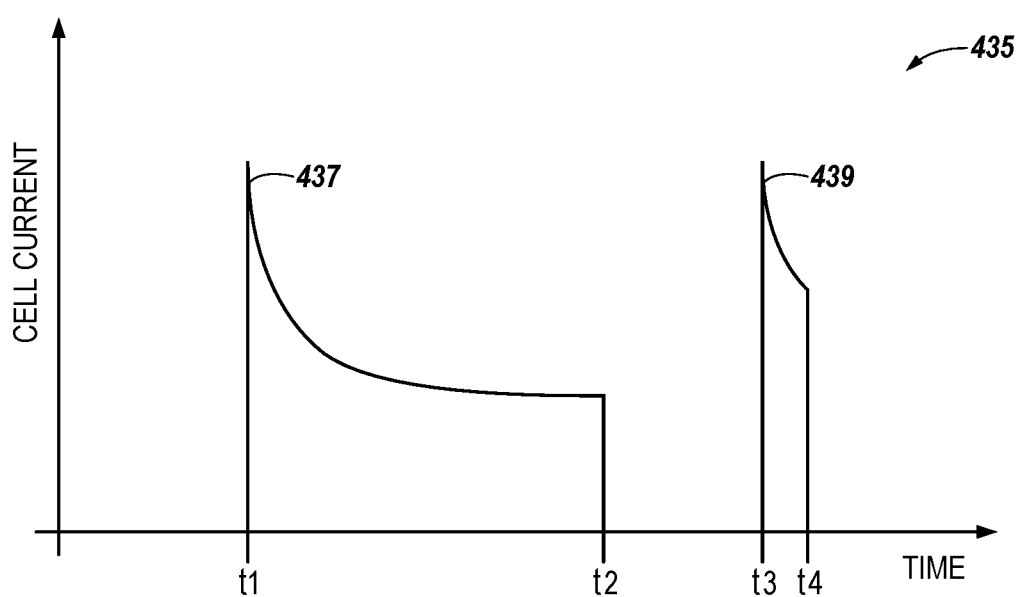
FIG. 4 illustrates an example of current flow through a memory cell, in accordance with an embodiment of the present disclosure.

FIG. 4 illustrates an example, in the form of graph 435, of current flow through a memory cell, in accordance with an embodiment of the present disclosure. For example, graph 435 can illustrate the current flow through a memory cell during an operation to program the memory cell to one of three possible data states in accordance with the present disclosure. The memory cell can be, for example, memory cell 325 and/or 125 previously described in connection with FIGS. 3 and 1, respectively.

At time t1 shown in FIG. 4, a bias voltage pulse with a magnitude high enough to cause the memory cell to snap back is applied to the memory cell. When the memory cell snaps back, a pulse 437 of current flows through the memory cell, as illustrated in FIG. 4, which can be used to detect the snap back event, as previously described herein. The current flow then dissipates after time t1, as shown in FIG. 4, and a DC current is established across the memory cell.

At time t2 shown in FIG. 4 (e.g., after memory cell has snapped back and the snapback event has been detected), the current to the memory cell is turned off (e.g., inhibited).

When the current to the memory cell is turned off, no current flows through the cell, as illustrated in FIG. 4.

At time t3 shown in FIG. 4 (e.g., after the current to the memory cell has been turned off), an additional voltage pulse can be applied to the memory cell. The additional voltage pulse can be applied to the memory cell based on a determination that the memory cell has snapped back, as previously described herein. Further, the additional pulse is applied to memory cell for a short amount of time (e.g., from time t3 to time t4), as illustrated in FIG. 4, and can have a negative or positive polarity, as previously described herein. As an additional example, the additional pulse can have a longer duration, and/or comprise a plurality of voltage pulses, as previously described herein.

When the additional voltage pulse is applied to the memory cell, an additional pulse 439 of current flows through the memory cell, as illustrated in FIG. 4. The additional pulse of current 439 can cause the memory cell to be programmed to one of the three possible data states, as previously described herein.

Figure 5A:
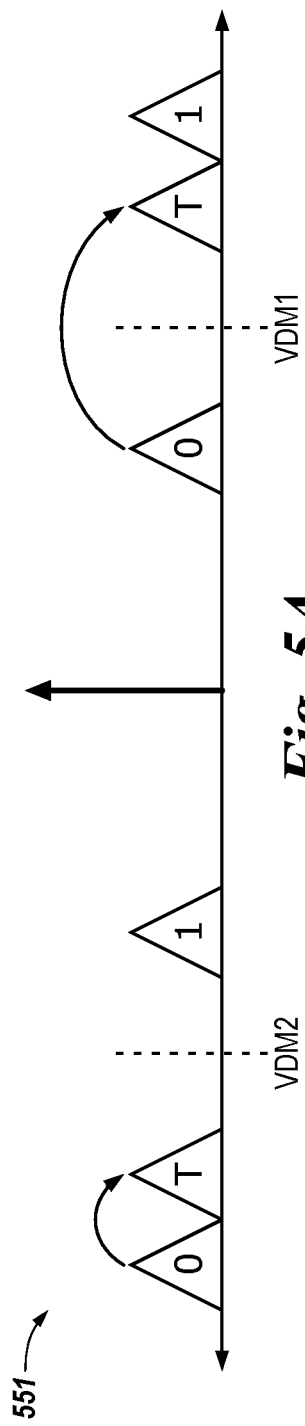
FIGS. 5A-5B illustrate examples of programming a memory cell to a third data state in accordance with an embodiment of the present disclosure.
Figure 5B:
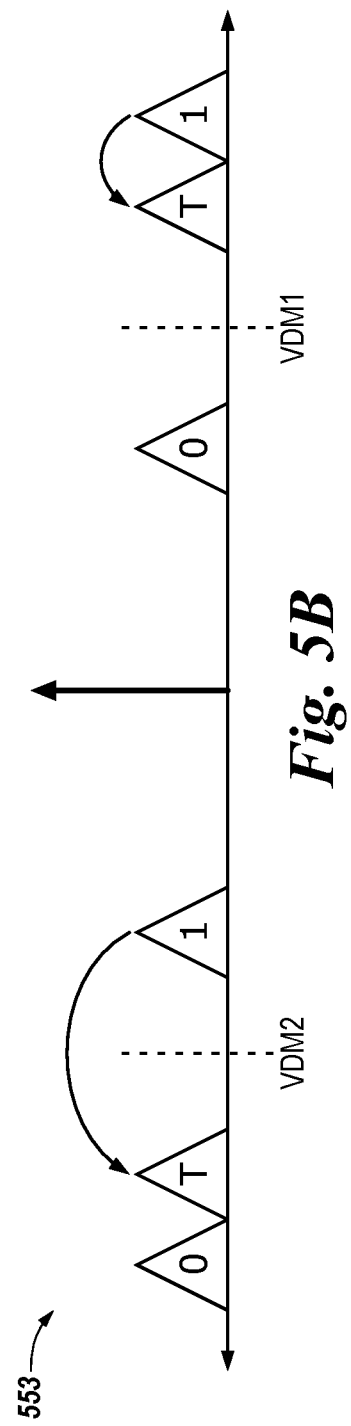

FIGS. 5A-5B illustrate examples of programming a memory cell to a third data state (e.g., state T) in accordance with an embodiment of the present disclosure. For instance, FIG. 5A illustrates an example 551 of programming a memory cell that is currently in a first data state (e.g., state 0) to state T, and FIG. 5B illustrates an example 553 of programming a memory cell that is currently in a second data state (e.g., state 1) to state T. The memory cell can be, for instance, memory cell 325 and/or 125 previously described in connection with FIGS. 3 and 1, respectively. Further, demarcation voltages VDM1 and VDM2 illustrated in FIGS. 5A-5B can be analogous to demarcation voltages VDM1 and VDM2, respectively, previously described in connection with FIGS. 2A-2C. Further, although the high magnitude threshold voltage distributions associated with state T are shown in FIGS. 5A-5B as being separate from the high magnitude threshold voltage distributions associated with states 0 and 1, these distributions may overlap, as in the example previously described in connection with FIG. 2A.

As shown in the example illustrated in FIG. 5A, applying a single short voltage pulse having a negative polarity and a magnitude greater than VDM1 and VDM2 (e.g., sufficient to reach the high threshold voltage state of the target memory cell) to a memory cell currently in state 0 can program the cell to state T (e.g., change the state of the cell from 0 to T). For example, as shown in FIG. 5A, the single short voltage pulse may not change a threshold voltage of the cell observed (e.g., measured) as a high magnitude threshold in the negative direction. However, a threshold voltage of the cell observed as a low magnitude threshold in the positive direction may increase to a high magnitude threshold, as shown in FIG. 5A.

As shown in the example illustrated in FIG. 5B, applying a single short voltage pulse having a positive polarity and a magnitude greater than VDM 1 and VDM2 (e.g., sufficient to reach the high threshold voltage state of the target memory cell) to a memory cell currently in state 1 can program the cell to state T (e.g., change the state of the cell from 1 to T). For example, as shown in FIG. 5B, the single short voltage pulse may not change a threshold voltage of the cell observed as a high magnitude threshold in the positive direction. However, a threshold voltage of the cell observed as a low magnitude threshold in the negative direction may increase to a high magnitude threshold, as shown in FIG. 5B.

Figure 6:
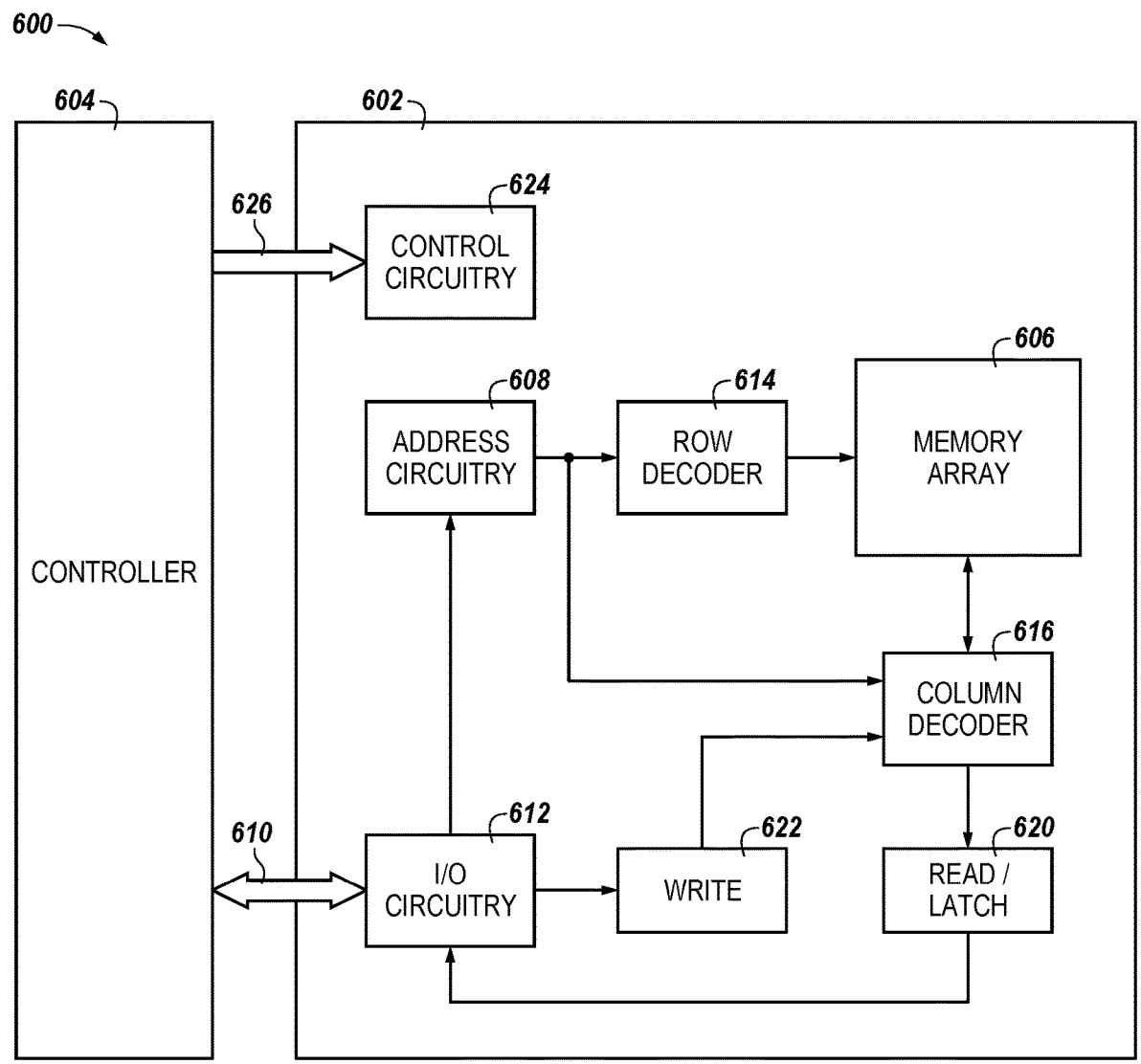
FIG. 6 is a block diagram illustration of an example apparatus, in accordance with an embodiment of the present disclosure.

FIG. 6 is a block diagram illustration of an example apparatus, such as an electronic memory system 600, in accordance with an embodiment of the present disclosure. Memory system 600 includes an apparatus, such as a memory device 602, and a controller 604, such as a memory controller (e.g., a host controller). Controller 604 might include a processor, for example. Controller 604 might be coupled to a host, for example, and may receive command signals (or commands), address signals (or addresses), and data signals (or data) from the host and may output data to the host.

Memory device 602 includes a memory array 606 of memory cells. For example, memory array 606 may include one or more of the memory arrays, such as a cross-point array, of memory cells disclosed herein.

Memory device 602 includes address circuitry 608 to latch address signals provided over I/O connections 610 through I/O circuitry 612. Address signals are received and decoded by a row decoder 614 and a column decoder 616 to access the memory array 606. For example, row decoder 614 and/or column decoder 616 may include drivers, such as drivers 350, as previously described in conjunction with FIG. 3.

Memory device 602 may sense (e.g., read) data in memory array 606 by sensing voltage and/or current changes in the memory array columns using sense/buffer circuitry that in some examples may be read/latch circuitry 620. Read/latch circuitry 620 may read and latch data from the memory array 606. I/O circuitry 612 is included for bi-directional data communication over the I/O connections 610 with controller 604. Write circuitry 622 is included to write data to memory array 606.

Control circuitry 624 may decode signals provided by control connections 626 from controller 604. These signals may include chip signals, write enable signals, and address latch signals that are used to control the operations on memory array 606, including data read and data write operations.

Control circuitry 624 may be included in controller 604, for example. Controller 604 may include other circuitry, firmware, software, or the like, whether alone or in combination. Controller 604 may be an external controller (e.g., in a separate die from the memory array 606, whether wholly or in part) or an internal controller (e.g., included in a same die as the memory array 606). For example, an internal controller might be a state machine or a memory sequencer.

In some examples, controller 604 may be configured to cause memory device 602 to at least perform the methods disclosed herein, such as programming the memory cells of array 606 to one of three possible data states. In some examples, memory device 602 may include the circuitry previously described in conjunction with FIG. 3. For example, memory device 602 may include the sense amplifier circuitry and latches, such as sense amplifier 330 and latch 340, disclosed herein.

As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship).

It will be appreciated by those skilled in the art that additional circuitry and signals can be provided, and that the memory system 600 of FIG. 6 has been simplified. It should be recognized that the functionality of the various block components described with reference to FIG. 6 may not necessarily be segregated to distinct components or component portions of an integrated circuit device. For example, a single component or component portion of an integrated circuit device could be adapted to perform the functionality of more than one block component of FIG. 6. Alternatively, one or more components or component portions of an integrated circuit device could be combined to perform the functionality of a single block component of FIG. 6.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a plurality of memory cells; and
circuitry configured to program a memory cell of the plurality of memory cells to one of three possible data states by:
applying a voltage pulse to the memory cell;
determining whether the memory cell snaps back in response to the applied voltage pulse; and
applying an additional voltage pulse to the memory cell based on the determination of whether the memory cell snaps back;
wherein the three possible data states include:
a first data state associated with a first threshold voltage distribution whose magnitude is greater for a first polarity than a second polarity;
a second data state associated with a second threshold voltage distribution whose magnitude is greater for the second polarity than the first polarity; and
a third data state associated with a third threshold voltage distribution whose magnitude is equal for the first polarity and the second polarity.

2. The apparatus of claim 1, wherein the circuitry is configured to turn off a current to the memory cell after determining the memory cell snaps back.

3. The apparatus of claim 1, wherein the circuitry comprises sense circuitry having a sense amplifier configured to sense a snap back of the memory cell in response to the applied voltage pulse.

4. The apparatus of claim 1, wherein each of the plurality of memory cells is a self-selecting memory cell in which a single material serves as a select element and a storage element.

5. The apparatus of claim 4, wherein the single material is a chalcogenide material.

6. A method of operating memory, comprising:
programming a memory cell to one of three possible data states by:
applying a voltage pulse to the memory cell;
determining whether the memory cell snaps back in response to the applied voltage pulse;
determining a current data state of the memory cell based on the determination of whether the memory cell snaps back; and
applying an additional voltage pulse to the memory cell based on the determination of the current data state of the memory cell;
wherein the three possible data states include:
a first data state associated with a first threshold voltage distribution whose magnitude is greater for a first polarity than a second polarity;
a second data state associated with a second threshold voltage distribution whose magnitude is greater for the second polarity than the first polarity; and
a third data state associated with a third threshold voltage distribution whose magnitude is equal for the first polarity and the second polarity.

7. The method of claim 6, wherein:
applying the additional voltage pulse to the memory cell does not change a magnitude of a threshold voltage of the memory cell if the threshold voltage is the first polarity; and
applying the additional voltage pulse to the memory cell increases the magnitude of the threshold voltage of the memory cell if the threshold voltage is the second polarity.

8. The method of claim 6, wherein:
applying the voltage pulse to the memory cell comprises:
applying a first voltage pulse having the first polarity to the memory cell; and
applying a second voltage pulse to the memory cell, wherein the second voltage pulse has the second polarity; and
determining whether the memory cell snaps back in response to the applied voltage pulse comprises determining whether the memory cell snaps back in response to the first voltage pulse or the second voltage pulse.

9. The method of claim 6, wherein applying the additional voltage pulse to the memory cell comprises determining whether to apply the additional voltage pulse to the memory cell based on the determination of the current data state of the memory cell.

10. The method of claim 6, wherein determining whether the memory cell snaps back in response to the applied voltage pulse comprises sensing a voltage change associated with the cell in response to the applied voltage pulse.

11. The method of claim 6, wherein a snap back of the memory cell comprises an impedance state of the memory cell changing from a first impedance state to a second impedance state.

12. The method of claim 6, wherein the method further includes latching a data value indicative of the determined current data state of the memory cell.

13. An apparatus, comprising:
a memory having a plurality of memory cells; and circuitry configured to program a memory cell of the plurality of memory cells to one of three possible data states by:
applying a first voltage pulse having a first polarity to the memory cell;
determining whether the memory cell snaps back in response to the applied first voltage pulse;
applying a first additional voltage pulse to the memory cell upon determining the memory cell snaps back in response to the applied first voltage pulse, wherein the first additional pulse has a second polarity that is opposite the first polarity; and
upon determining the memory cell does not snap back in response to the applied first voltage pulse:
applying a second voltage pulse having the second polarity to the memory cell;
determining whether the memory cell snaps back in response to the applied second voltage pulse; and
applying a second additional voltage pulse having the first polarity to the memory cell upon determining the memory cell snaps back in response to the applied second voltage pulse.

14. The apparatus of claim 13, wherein the circuitry is further configured to program the memory to the one of the three possible data states by not applying an additional voltage pulse to the memory cell upon determining the memory cell does not snap back in response to the applied second voltage pulse.

15. The apparatus of claim 13, wherein;
the first polarity is a positive polarity; and
the second polarity is a negative polarity.

16. The apparatus of claim 13, wherein applying the first additional voltage pulse to the memory cell comprises applying a single additional voltage pulse to the memory cell.

17. The apparatus of claim 13, wherein the one of the three possible data states is associated with a symmetric threshold voltage distribution whose magnitude is substantially equal for a positive polarity and a negative polarity.

18. The apparatus of claim 13, wherein the circuitry is further configured to program a memory cell of the plurality of memory cells to the one of the three possible data states by:
applying a first voltage pulse having a first polarity to the memory cell; and
applying a second voltage pulse having a second polarity to the memory cell without determining whether the memory cell snaps back in response to the applied first voltage pulse, wherein the second polarity is opposite the first polarity.

19. An apparatus, comprising:
a memory having a plurality of memory cells; and
circuitry configured to program a memory cell of the plurality of memory cells to one of three possible data states by:
applying a first voltage pulse having a first polarity to the memory cell;
determining whether the memory cell snaps back in response to the applied first voltage pulse;
applying a plurality of additional voltage pulses to the memory cell upon determining the memory cell snaps back in response to the applied first voltage pulse, wherein each of the plurality of additional voltage pulses has a second polarity that is opposite the first polarity; and
upon determining the memory cell does not snap back in response to the applied first voltage pulse:
applying a second voltage pulse having the second polarity to the memory cell;
determining whether the memory cell snaps back in response to the applied second voltage pulse; and
applying the plurality of additional voltage pulses to the memory cell upon determining the memory cell does not snap back in response to the applied second voltage pulse.

20. The apparatus of claim 19, wherein the circuitry is further configured to program the memory cell to the one of the three possible data states by not applying the plurality of additional voltage pulses upon determining the memory cell snaps back in response to the applied second voltage pulse.

21. The apparatus of claim 19, wherein the one of the three possible data states is associated with an asymmetric threshold voltage distribution whose magnitude is greater for a positive polarity than a negative polarity.

22. The apparatus of claim 19, wherein the circuitry is further configured to program a memory cell of the plurality of memory cells to the one of the three possible data states by applying a plurality of voltage pulses to the memory cell without determining whether the memory cell snaps back in response to any of the applied voltage pulses, wherein each of the plurality of voltage pulses has a negative polarity.

* * * * *